(12) United States Patent  (10) Patent No.: US 7,947,542 B2
Liu et al.  (45) Date of Patent: May 24, 2011

(54) METHOD FOR MAKING THIN FILM TRANSISTOR

(75) Inventors: Kai Liu, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/384,331

(22) Filed: Apr. 2, 2009

(65) Prior Publication Data

US 2010/0075469 A1 Mar. 25, 2010

(30) Foreign Application Priority Data

May 14, 2008 (CN) .............................. 200810067163

(51) Int. Cl.
H01L 21/00 (2006.01)
(52) U.S. Cl. ........ 438/151; 438/182; 257/241; 257/266; 257/E21.411; 257/E23.145; 257/E33.012; 257/E51.04; 977/708; 977/720; 977/723; 977/742; 977/743; 977/750; 977/751; 977/779; 977/784; 977/789; 977/796
(58) Field of Classification Search .................. None
See application file for complete search history.

(56) References Cited

U.S. PATENT DOCUMENTS

| 6,423,583 | B1 | 7/2002 | Avouris et al. |
| 6,814,832 | B2 | 11/2004 | Utsunomiya |
| 6,921,575 | B2 | 7/2005 | Horiuchi et al. |
| 7,285,501 | B2 | 10/2007 | Mardilovich et al. |
| 7,399,400 | B2 | 7/2008 | Soundarrajan et al. |
| 7,537,975 | B2 | 5/2009 | Moon et al. |
| 2002/0163079 | A1* | 11/2002 | Awano .......................... 257/750 |
| 2004/0251504 | A1 | 12/2004 | Noda et al. |
| 2005/0061496 | A1 | 3/2005 | Matabayas |
| 2005/0079659 | A1 | 4/2005 | Duan et al. |
| 2005/0106846 | A1 | 5/2005 | Dubin |
| 2005/0189535 | A1 | 9/2005 | Hsueh et al. |
| 2006/0249817 | A1 | 11/2006 | Kawase et al. |

(Continued)

FOREIGN PATENT DOCUMENTS

CN 1484865 3/2004

(Continued)

OTHER PUBLICATIONS

Jiang et al. ("Spinning and processing continuous yarns from 4-inch wafer scale super-aligned carbon nanotube arrays", Advanced Materials, 18, pp. 1505-1510, 2006).*

(Continued)

*Primary Examiner* — Charles Garber
*Assistant Examiner* — Yasser A Abdelaziez
(74) *Attorney, Agent, or Firm* — D. Austin Bonderer

(57) ABSTRACT

A method for making a thin film transistor, the method comprising the steps of: (a) providing a carbon nanotube array and an insulating substrate; (b) pulling out a carbon nanotube film from the carbon nanotube array by using a tool; (c) placing at least one carbon nanotube film on a surface of the insulating substrate, to form a carbon nanotube layer thereon; (d) forming a source electrode and a drain electrode; wherein the source electrode and the drain electrode being spaced therebetween, and electrically connected to the carbon nanotube layer; and (e) covering the carbon nanotube layer with an insulating layer, and a gate electrode being located on the insulating layer.

18 Claims, 6 Drawing Sheets

U.S. PATENT DOCUMENTS

| | | | |
|---|---|---|---|
| 2007/0004191 A1 | 1/2007 | Gu et al. | |
| 2007/0012922 A1 | 1/2007 | Harada et al. | |
| 2007/0029612 A1 | 2/2007 | Sandhu | |
| 2007/0069212 A1 | 3/2007 | Saitoh et al. | |
| 2007/0085460 A1 | 4/2007 | Harutyunyan et al. | |
| 2007/0108480 A1 | 5/2007 | Nanai et al. | |
| 2007/0132953 A1 | 6/2007 | Silverstein | |
| 2007/0138010 A1 | 6/2007 | Ajayan | |
| 2007/0273796 A1 | 11/2007 | Silverstein et al. | |
| 2007/0273797 A1 | 11/2007 | Silverstein et al. | |
| 2007/0273798 A1 | 11/2007 | Silverstein et al. | |
| 2008/0042287 A1 | 2/2008 | Furukawa et al. | |
| 2008/0134961 A1 | 6/2008 | Bao et al. | |
| 2008/0173864 A1 | 7/2008 | Fujita et al. | |
| 2008/0252202 A1 | 10/2008 | Li et al. | |
| 2008/0265293 A1 | 10/2008 | Lee et al. | |
| 2008/0273280 A1* | 11/2008 | Chen et al. | 361/56 |
| 2008/0277718 A1 | 11/2008 | Ionescu et al. | |
| 2009/0098453 A1 | 4/2009 | Liu et al. | |
| 2009/0159891 A1 | 6/2009 | Daniel et al. | |
| 2009/0224292 A1 | 9/2009 | Asano et al. | |
| 2009/0256594 A1 | 10/2009 | Zhu | |
| 2009/0272967 A1 | 11/2009 | Afzali-Ardakani et al. | |
| 2009/0282802 A1 | 11/2009 | Cooper et al. | |
| 2010/0028613 A1 | 2/2010 | Schmidt et al. | |
| 2010/0252802 A1 | 10/2010 | Numata et al. | |

FOREIGN PATENT DOCUMENTS

| | | |
|---|---|---|
| CN | 1490856 A | 4/2004 |
| CN | 1745468 | 3/2006 |
| CN | 1823426 | 8/2006 |
| CN | 1853268 | 10/2006 |
| JP | 2007-73706 | 3/2007 |
| JP | 2007-123870 | 5/2007 |
| JP | 2009-32894 | 2/2009 |
| WO | WO2004032193 | 4/2004 |
| WO | WO2006093601 A2 | 9/2006 |
| WO | WO2007089322 | 8/2007 |
| WO | WO2007126412 | 11/2007 |
| WO | WO2008075642 | 6/2008 |

OTHER PUBLICATIONS

IBM research article on IBM research site (enclosed herein, 2004).*

Minko et al. ("Two-level structured self-adaptive surfaces with reversibly tunable properties", Journal of American Chemical Society, 125, pp. 3896-3900, 2003), (hereinafter, Minko).*

Cao et al. ("Flow-induced planar assembly of parallel carbon nanotubes and crossed nanotube junctions", J. of Nanoscience and Nanotechonolgy, vol. 5, pp. 1177-1180, 2005).*

R. E. I. Schropp, B. Stannowski, J. K. Rath, New challenges in thin film transistor research, Journal of Non-Crystalline Solids, 299-302, 2002, 1304-1310, 2002.

Hines "Nanotransfer printing of organic and carbon nanotube thin-film transistors on plastic substrates", Applied Physics Letters, 86,163101 (2005).

Li "Removal of shells of multi-wall carbon nanotubes by repeatedly scanning bias voltage" Science in China Ser. E, Technological Sciences, vol. 47 No. 1 pp. 1-5 (2004).

Ryu "Low-Temperature Growth of Carbon Nanotube by Plasma-Enhanced Chemical Vapor Deposition using Nickel Catalyst". Jpn. J. Appl. Phys. vol. 42, pp. 3578-3581 (2003).

Meitl et al., Solution Casting and Transfer Printing Single-Walled Carbon Nanotube Films, Nano Letters, 2004, vol. 4, No. 9.

* cited by examiner

METHOD FOR MAKING THIN FILM TRANSISTOR

RELATED APPLICATIONS

This application claims all benefits accruing under 35 U.S.C. §119 from China Patent Application No. 200810067163.6, filed on May 14, 2008 in the China Intellectual Property Office, the contents of which are hereby incorporated by reference. This application is related to commonly-assigned applications entitled, "THIN FILM TRANSISTOR", 12/384309, filed on Apr. 2, 2009; "METHOD FOR MAKING THIN FILM TRANSISTOR", 12/384245, filed on Apr. 2, 2009; "THIN FILM TRANSISTOR", 12/384329, filed on Apr. 2, 2009; "THIN FILM TRANSISTOR", 12/384310, filed on Apr. 2, 2009; "THIN FILM TRANSISTOR PANEL", 12/384244, filed on Apr. 2, 2009; "THIN FILM TRANSISTOR", 12/384281, filed on Apr. 2, 2009; "THIN FILM TRANSISTOR", 12/384299, filed on Apr. 2, 2009; "THIN FILM TRANSISTOR", 12/384292, filed on Apr. 2, 2009; "THIN FILM TRANSISTOR", 12/384293, filed on Apr. 2, 2009; "THIN FILM TRANSISTOR", 12/384330, filed on Apr. 2, 2009; "METHOD FOR MAKING THIN FILM TRANSISTOR", 12/384241, filed on Apr. 2, 2009; "THIN FILM TRANSISTOR", 12/384238, filed on Apr. 2, 2009. The disclosures of the above-identified applications are incorporated herein by reference.

BACKGROUND

1. Field of the Invention

The present invention relates to methods for making thin film transistors and, particularly, to a method for making a carbon nanotube based thin film transistor.

2. Discussion of Related Art

A typical thin film transistor (TFT) is made of a substrate, a gate electrode, an insulation layer, a drain electrode, a source electrode, and a semiconducting layer. The thin film transistor performs a switching operation. In use, the thin film transistor modulate an amount of carriers accumulated in an interface between the insulation layer and the semiconducting layer from an accumulation state to a depletion state, with applied voltage to the gate electrode. Thus, the thin film transistor can change an amount of the current passing between the drain electrode and the source electrode. In practical use, a high carrier mobility affect by the material of the semiconducting layer of the thin film transistor is desired.

In prior art, the material of the semiconducting layer is amorphous silicon (a-Si), poly-silicon (p-Si), or organic semiconducting material. The carrier mobility of an a-Si TFT is relatively lower than a p-Si TFT. However, the method for making the p-Si TFT is complicated and has a high cost. The organic TFT is flexible but has low carrier mobility.

Carbon nanotubes (CNTs) are a novel carbonaceous material and received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by the arrangement of the carbon atoms therein. The carrier mobility of semiconducting carbon nanotubes along a length direction thereof can reach about 1000 to 1500 $cm^2V^{-1}s^{-1}$. Thus, in prior art, a TFT adopting carbon nanotubes as a semiconducting layer has been produced.

Conventional methods for making a carbon nanotube based TFT includes the steps of: dispersing an amount of carbon nanotube powder in an organic solvent to form a mixture; printing the mixture on a substrate; volatilizing the organic solvent to achieve a carbon nanotube layer on the substrate; forming a source electrode and a drain electrode on the carbon nanotube layer; forming a silicon nitride layer on the carbon nanotube layer; and forming a gate electrode on the insulating layer.

However, firstly, the carbon nanotubes are prone to aggregate in the mixture. Thus, the carbon nanotubes cannot be uniformly dispersed in the carbon nanotube layer. Secondly, the organic solvent is hard to eliminate from the carbon nanotube layer. Thus, impurities exist in the carbon nanotube layer. Thirdly, the carbon nanotubes in the carbon nanotube layer are disordered, thus the high carrier mobility of the carbon nanotube along the length direction thereof cannot be well used in the TFT. Additionally, the carbon nanotube layer formed by the printing method is inflexible. Accordingly, the TFT is inflexible.

What is needed, therefore, is a method for making a TFT in which the above problems are eliminated or at least alleviated.

BRIEF DESCRIPTION OF THE DRAWINGS

Many aspects of the present method for making the thin film transistor can be better understood with references to the following drawings. The components in the drawings are not necessarily drawn to scale, the emphasis instead being placed upon clearly illustrating the principles of the present method for making the carbon nanotube based thin film transistor.

Figure 1:
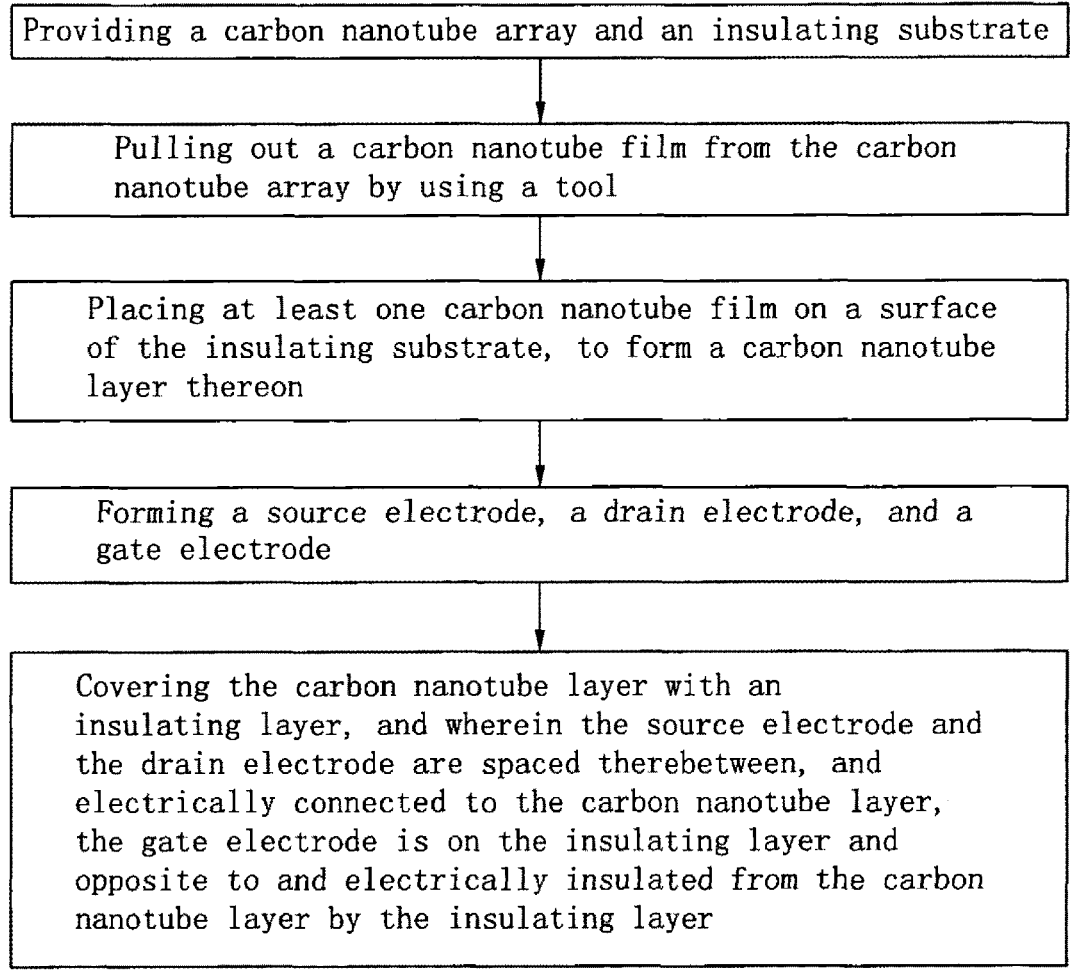
FIG. 1 is a flow chart of a method for making a thin film transistor in accordance with a first embodiment.

Corresponding reference characters indicate corresponding parts throughout the several views. The exemplifications set out herein illustrate at least one embodiment of the present method for making the thin film transistor, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present method for making the thin film transistor.

Figure 2:
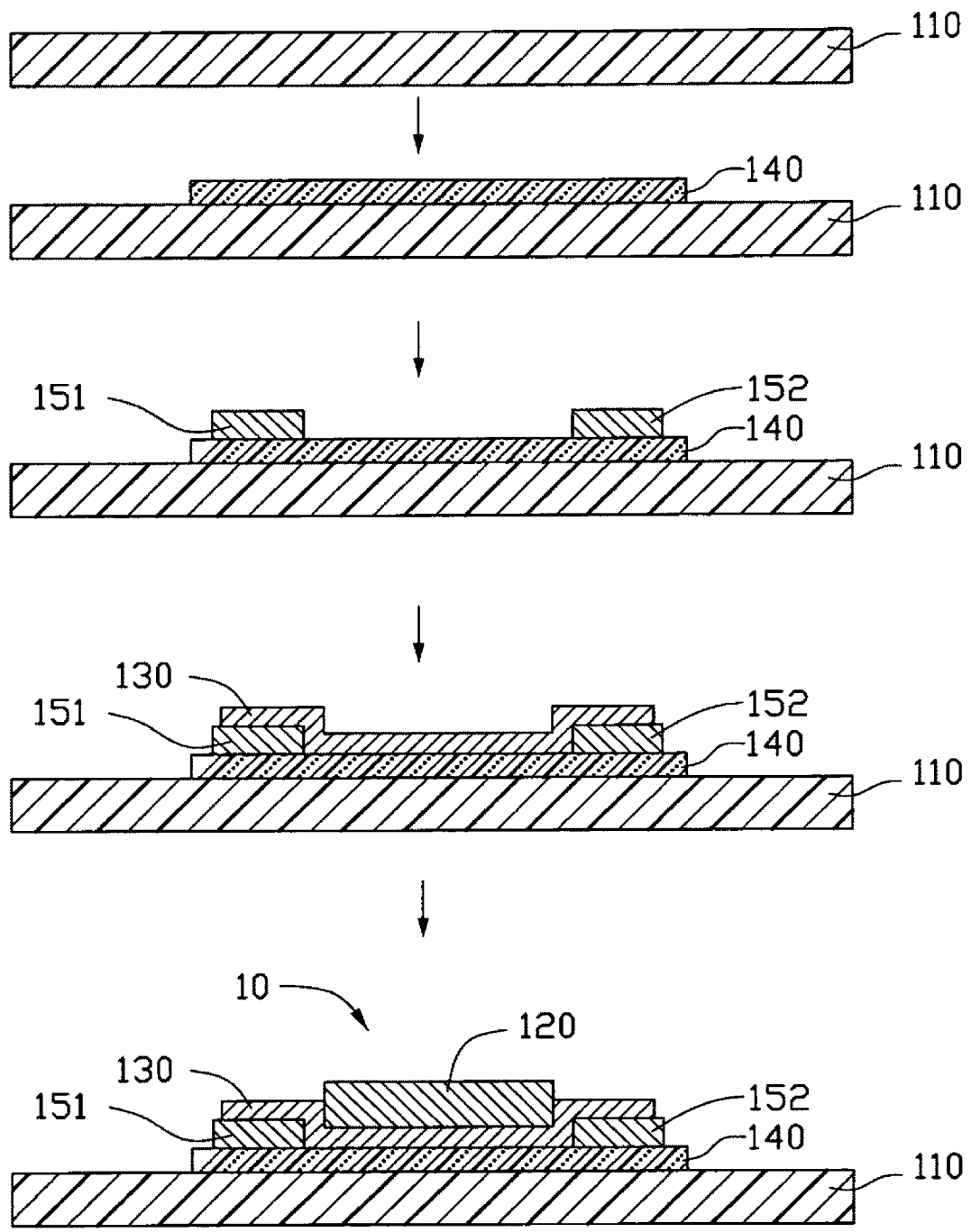
FIG. 2 is a schematic view of the method for making the thin film transistor of FIG. 1.

Referring to FIG. 1 and FIG. 2, a method for making a thin film transistor 10 having a top gate structure is provided in a first embodiment, and includes the following steps:

(a) providing a carbon nanotube array and an insulating substrate 110;

(b) pulling out a carbon nanotube film from the carbon nanotube array by using a tool (e.g., adhesive tape, pliers, tweezers, or another tool allowing multiple carbon nanotubes to be gripped and pulled simultaneously);

(c) placing at least one carbon nanotube film on a surface of the insulating substrate 110, to form a carbon nanotube layer 140 thereon;

(d) forming a source electrode 151, a drain electrode 152, and a gate electrode 120;

(e) covering the carbon nanotube layer 140 with an insulating layer 130, wherein the source electrode 151 and the drain electrode 152 are spaced therebetween, and electrically connected to the carbon nanotube layer 140, the gate electrode 120 is opposite to and electrically insulated from the carbon nanotube layer 140 by the insulating layer 130.

In step (a), the material of the insulating substrate 110 can be the same as a substrate of a print circuit board (PCB), and can be selected from a rigid material (e.g., p-type or n-type silicon, silicon with a silicon dioxide layer formed thereon, crystal, crystal with a oxide layer formed thereon), or a flexible material (e.g., plastic or resin). In the present embodiment, the material of the insulating substrate is polyethylene terephthalate (PET). The shape and size of the insulating substrate 110 is arbitrary.

In step (a), a super-aligned carbon nanotube array can be used and is formed by the following substeps: (a1) providing a substantially flat and smooth substrate; (a2) forming a catalyst layer on the substrate; (a3) annealing the substrate with the catalyst layer in air at a temperature approximately ranging from 700° C. to 900° C. for about 30 to 90 minutes; (a4) heating the substrate with the catalyst layer to a temperature approximately ranging from 500° C. to 740° C. in a furnace with a protective gas therein; and (a5) supplying a carbon source gas to the furnace for about 5 to 30 minutes and growing the super-aligned carbon nanotube array on the substrate.

In step (a1), the substrate can be a P-type silicon wafer, an N-type silicon wafer, or a silicon wafer with a film of silicon dioxide thereon. In the present embodiment, a 4-inch P-type silicon wafer is used as the substrate.

In step (a2), the catalyst can be made of iron (Fe), cobalt (Co), nickel (Ni), or any alloy thereof.

In step (a4), the protective gas can be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The super-aligned carbon nanotube array can be approximately 200 to 400 microns in height and include a plurality of carbon nanotubes parallel to each other and approximately perpendicular to the substrate. The carbon nanotubes in the carbon nanotube array can be single-walled carbon nanotubes, double-walled carbon nanotubes, or multi-walled carbon nanotubes. Diameters of the single-walled carbon nanotubes approximately range from 0.5 nanometers to 10 nanometers. Diameters of the double-walled carbon nanotubes approximately range from 1 nanometer to 50 nanometers. Diameters of the multi-walled carbon nanotubes approximately range from 1.5 nanometers to 50 nanometers.

The super-aligned carbon nanotube array formed under the above conditions is essentially free of impurities such as carbonaceous or residual catalyst particles. The carbon nanotubes in the super-aligned carbon nanotube array are closely packed together by van der Waals attractive force.

In step (b), the carbon nanotube film can be formed by the following substeps: (b1) selecting one or more carbon nanotube having a predetermined width from the super-aligned array of carbon nanotubes; and (b2) pulling the carbon nanotubes to form carbon nanotube segments at an even/uniform speed to achieve a uniform carbon nanotube film.

In step (b1), the carbon nanotubes having a predetermined width can be selected by using an adhesive tape such as the tool to contact the super-aligned carbon nanotube array. Each carbon nanotube segment includes a plurality of carbon nanotubes parallel to each other. In step (b2), the pulling direction is arbitrary (e.g., substantially perpendicular to the growing direction of the super-aligned carbon nanotube array).

Figure 3:
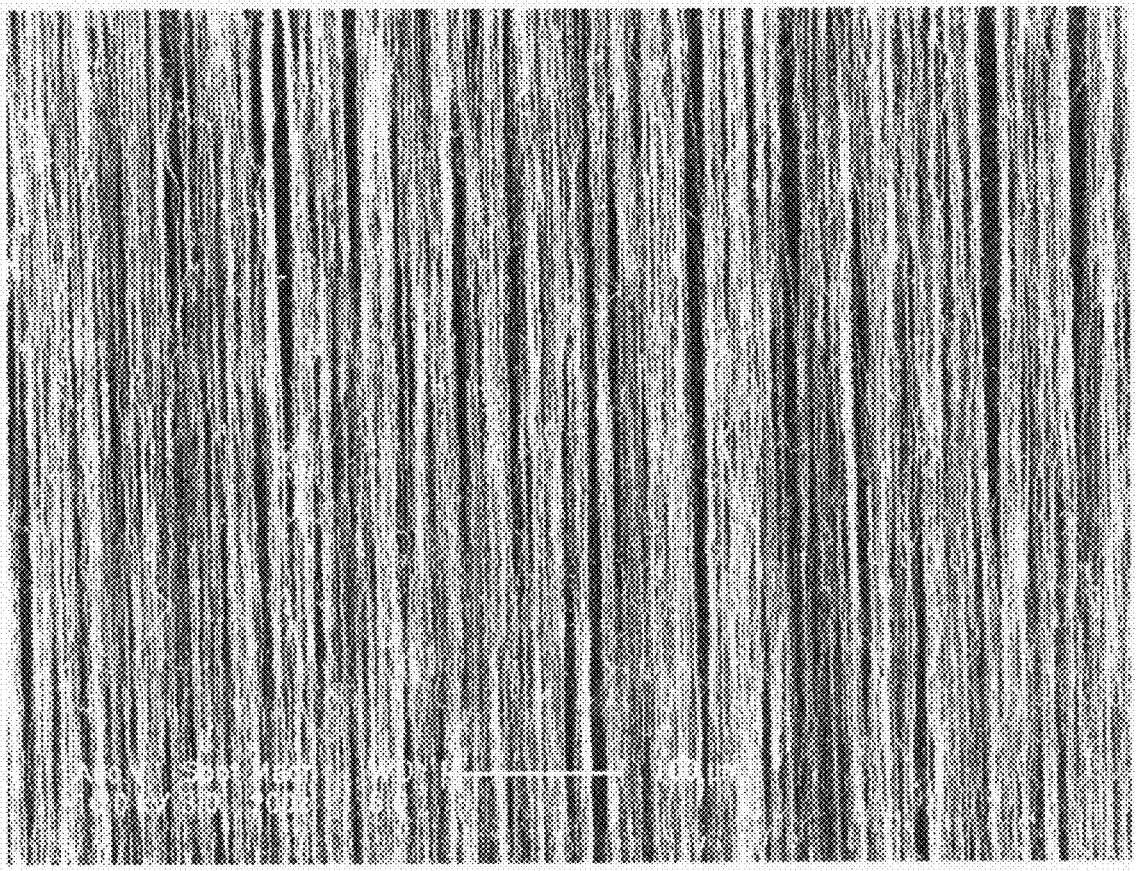
FIG. 3 shows a Scanning Electron Microscope (SEM) image of a carbon nanotube film used in the thin film transistor of FIG. 1.

More specifically, during the pulling process, as the initial carbon nanotube segments are drawn out, other carbon nanotube segments are also drawn out end to end due to van der Waals attractive force between ends of adjacent segments. This process of drawing ensures a substantially continuous and uniform carbon nanotube film having a predetermined width can be formed. Referring to FIG. 3, the carbon nanotube film includes a plurality of carbon nanotubes joined ends to ends. While there is some variation, the carbon nanotubes in the carbon nanotube film are all substantially parallel to the pulling/drawing direction of the carbon nanotube film, and the carbon nanotube film produced in such manner can be selectively formed to have a predetermined width. The carbon nanotube film formed by the pulling/drawing method has superior uniformity of thickness and conductivity over a typical disordered carbon nanotube film. Further, the pulling/drawing method is simple, fast, and suitable for industrial applications.

The maximum width of the carbon nanotube film depends on a size of the carbon nanotube array. The length of the carbon nanotube film can be arbitrarily set as desired (e.g., 1 centimeter to 100 meters). When the substrate is a 4-inch P-type silicon wafer, as in the present embodiment, the width of the carbon nanotube film approximately ranges from 0.01 centimeters to 10 centimeters, and the thickness of the carbon nanotube film approximately ranges from 0.5 nanometers to 100 microns.

In step (c), the carbon nanotube layer 140 is used as a semiconducting layer. It is noted that because the carbon nanotubes in the super-aligned carbon nanotube array have a high purity and a high specific surface area, the carbon nanotube film is adherent in nature. As such, the carbon nanotube film can be directly adhered to the surface of the insulating substrate 110. It is noted that, a plurality of carbon nanotube films can be formed in step (b), and stacked and/or placed side by side on the insulating substrate 110 to form the carbon nanotube layer 140. Two adjacent carbon nanotube films are combined by van der Waals attractive force therebetween. The aligned direction of the carbon nanotube films is arbitrary. That is, the carbon nanotubes in each carbon nanotube film are aligned along a same direction. The carbon nanotubes in different carbon nanotube films can aligned along a same direction or different directions.

It is noted that, the carbon nanotube layer 140, adhered to the surface of the insulating substrate 110, can be treated with an organic solvent. Specifically, the carbon nanotube film can be treated by applying organic solvent to the carbon nanotube film to soak the entire surface of the carbon nanotube film. The organic solvent is volatilizable and can, suitably, be selected from the group consisting of ethanol, methanol, acetone, dichloroethane, chloroform, any appropriate mixture thereof. In the present embodiment, the organic solvent is ethanol. After being soaked by the organic solvent, microscopically, carbon nanotube strings will be formed by adjacent carbon nanotubes, that are able to do so, bundling together, due to the surface tension of the organic solvent. In one aspect, some parts of the carbon nanotubes in the untreated carbon nanotube film that are not adhered on the substrate will come into contact with the insulating substrate 110 after the organic solvent treatment due to the surface tension of the organic solvent. Then the contacting area of the carbon nanotube film with the substrate will increase, and thus, the carbon nanotube film can more firmly adhere to the surface of the insulating substrate 110. In another aspect, due to the decrease of the specific surface area via bundling, the mechanical strength and toughness of the carbon nanotube film are increased and the coefficient of friction of the carbon nanotube films is reduced. Macroscopically, the treated film will be approximately the same uniform carbon nanotube film as the no treated.

In step (d), the material of the source electrode 151, the drain electrode 152, and the gate electrode 120 has a good conductive property, and can be selected from a group consisting of pure metals, metal alloys, indium tin oxide (ITO), antimony tin oxide (ATO), silver paste, conductive polymer, and metallic carbon nanotubes. A thickness of the source electrode 151, the drain electrode 152, and the gate electrode 120 is about 0.5 nanometers to 100 microns. A distance between the source electrode 151 and the drain electrode 152 is about 1 to 100 microns.

In one embodiment, when the source electrode 151, the drain electrode 152, and the gate electrode 120 are made of pure metals, metal alloys, indium tin oxide (ITO), or antimony tin oxide (ATO), a conducting layer can be formed by a depositing, sputtering, evaporating method, and etched to form the source electrode 151 and the drain electrode 152. In other embodiments, the source electrode 151, the drain electrode 152, and the gate electrode 120 are made of silver paste or conductive polymer can be formed directly by a print method. In other embodiment, carbon nanotube films with metallic carbon nanotubes therein can be separately adhered on the substrate or the carbon nanotube layer 140 to form the source electrode 151 and the drain electrode 152, and can be adhered on the insulating layer 130 to form the gate electrode 120.

In the present embodiment, the source electrode 151 and the drain electrode 152 are separately formed on two ends of the carbon nanotube layer 140. The carbon nanotubes in the carbon nanotube layer 140 aligned along a direction from the source electrode 151 to the drain electrode 152, to form a carrier channel from the source electrode 151 to the drain electrode 152.

In the present embodiment, the material of the source electrode 151, the drain electrode 152, and the gate electrode 120 is pure metal, and step (d) can be performed by a lift-off method or an etching method. The thickness of the source electrode 151 and the drain electrode 152 is about 1 micron. The distance between the source electrode 151 and the drain electrode 152 is about 50 microns.

It is to be understood that, to achieve a semiconducting layer, an additional step (g) of eliminating the metallic carbon nanotubes in the carbon nanotube layer 140 can be further performed before step (d). In one embodiment, the step (g) can be performed by applying a voltage between the source electrode 151 and the drain electrode 152, to break down the metallic carbon nanotubes in the carbon nanotube layer 140, and thereby achieve a semiconducting layer with semiconducting carbon nanotubes therein. The voltage is in a range from 1 to 1000 volts (V). In another embodiment, the step (g) can be performed by irradiating the carbon nanotube layer 140 with a hydrogen plasma, microwave, terahertz (THz), infrared (IR), ultraviolet (UV), or visible light (Vis), to break down the metallic carbon nanotubes in the carbon nanotube layer 140, and thereby achieve a semiconducting layer with semiconducting carbon nanotubes therein.

In step (e), the material of the insulating layer 130 can be a rigid material such as silicon nitride ($Si_3N4$) or silicon dioxide ($SiO_2$), or a flexible material such as PET, benzocyclobutenes (BCB), or acrylic resins. The insulating layer 130 can be depositing, sputtering, evaporating, or printing method according to the material thereof. A thickness of the insulating layer 130 can be in a range from 0.5 nanometers to 100 microns.

In the present embodiment, a $Si_3N_4$ insulating layer 130 is deposited on the carbon nanotube layer 140, the source electrode 151, and the drain electrode 152 by a PECVD method. The thickness of the insulating layer 130 is about 1 micron.

To be used in a device (e.g., a display), the insulating layer 130 can be further etched to form exposure holes to expose a part of the source electrode 151, and the drain electrode 152.

Figure 4:
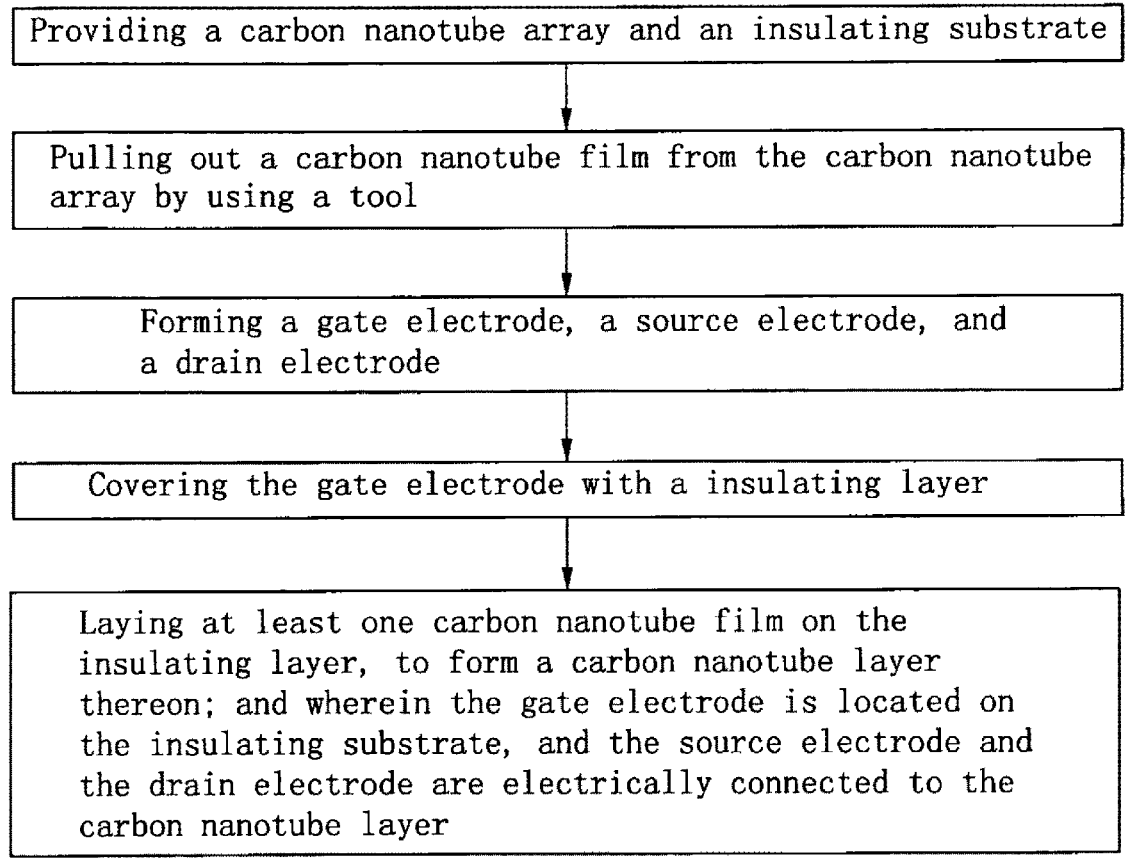
FIG. 4 is a flow chart of a method for making a thin film transistor in accordance with a second embodiment.
Figure 5:
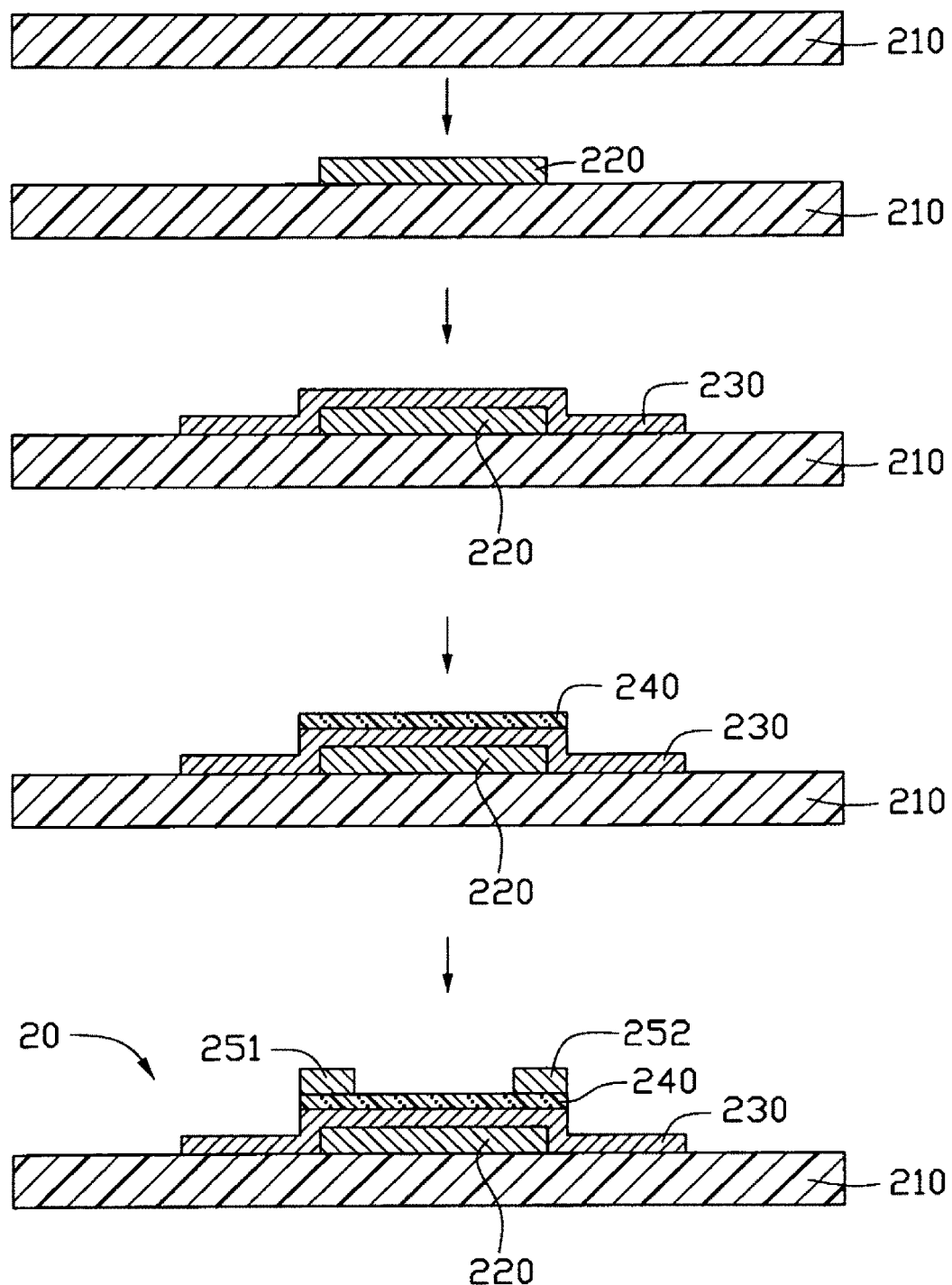
FIG. 5 is a schematic view of the method for making the thin film transistor of FIG. 4.

Referring to FIG. 4 and FIG. 5, a method for making the thin film transistor 20 having a bottom gate structure is provided in a second embodiment, and is substantially the same as the method form making the thin film transistor 10 in the first embodiment. The main difference between the two methods is that the thin film transistor 20 has a bottom gate structure.

The method for making the thin film transistor 20 includes steps of:
(a') providing a carbon nanotube array and an insulating substrate 210;
(b') pulling out a carbon nanotube film from the carbon nanotube array by using a tool (e.g., adhesive tape, pliers, tweezers, or another tool allowing multiple carbon nanotubes to be gripped and pulled simultaneously);
(c') forming a gate electrode 220, a source electrode 251, and a drain electrode 252;
(d') covering the gate electrode 220 with a insulating layer 230;
(e') laying at least one carbon nanotube film on the insulating layer 230, to form a carbon nanotube layer 240 thereon; and
wherein the gate electrode 220 is located on a surface of the insulating substrate 210; the source electrode 251 and the drain electrode 252 are spaced therebetween, and electrically connected to the carbon nanotube layer 230.

The carbon nanotube layer 240 is formed opposite to and insulated from the gate electrode 220.

Figure 6:
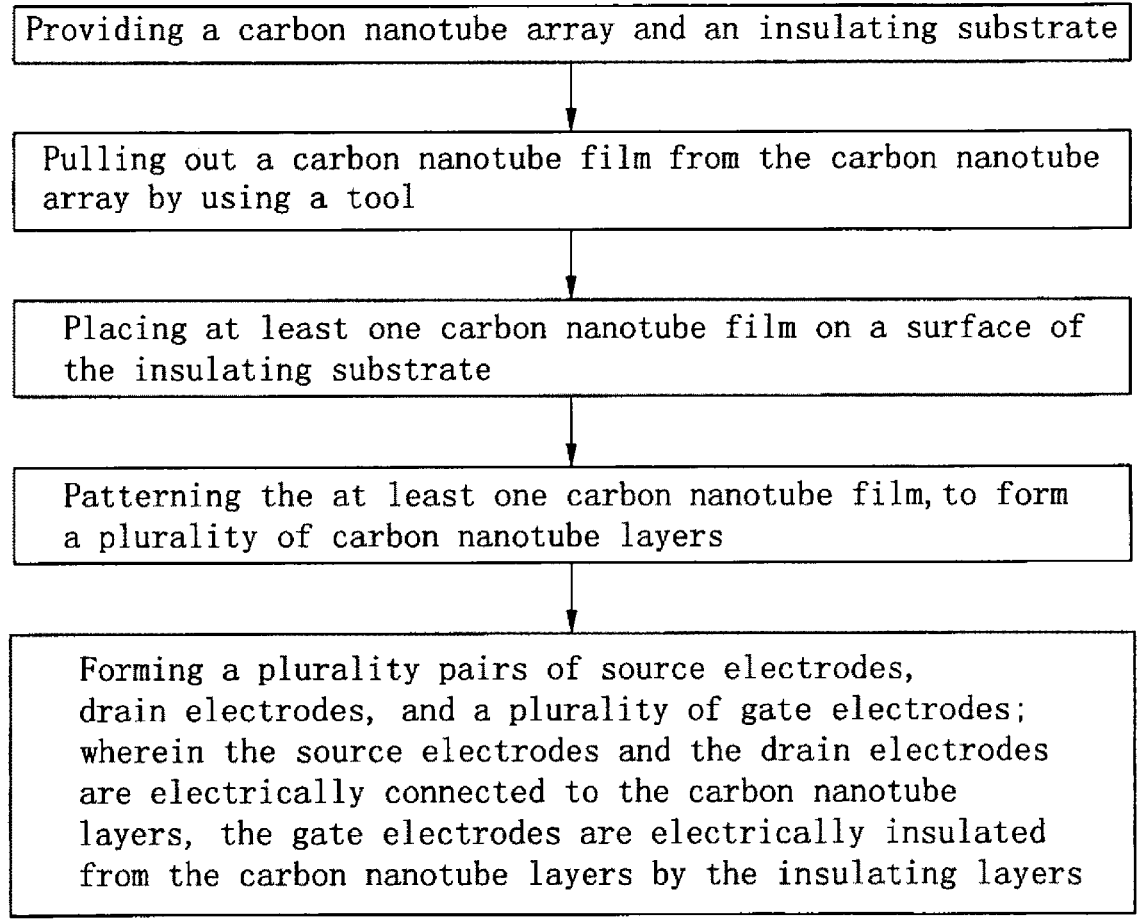
FIG. 6 is a flow chart of a method for making a thin film transistor in accordance with a third embodiment.

Referring to FIG. 6, a method for making an array of thin film transistors is provided in a third embodiment, and is substantially the same as the method for making the thin film transistor 10 in the first embodiment. The main difference is that, in the third embodiment, a plurality of thin film transistors is formed in a same substrate, thereby achieving the array of thin film transistors.

The method for making the array of thin film transistors includes steps of:
(a") providing a carbon nanotube array and an insulating substrate;
(b") pulling out a carbon nanotube film from the carbon nanotube array by using a tool (e.g., adhesive tape, pliers, tweezers, or another tool allowing multiple carbon nanotubes to be gripped and pulled simultaneously);
(c") laying at least one carbon nanotube film on a surface of the insulating substrate;
(d") patterning the at least one carbon nanotube film, to form a plurality of carbon nanotube layers thereon;
(e") forming a plurality of pairs of source electrodes and drain electrodes, and a plurality of gate electrodes separately; and
(f") covering the carbon nanotube layers with the insulating layers.
wherein the source electrodes and the drain electrodes are spaced therebetween, and electrically connected to the carbon nanotube layers, the gate electrodes are electrically insulated from the carbon nanotube layers by the insulating layers.

In step (d"), the at least one carbon nanotube film can be cut by laser beam, or etched by plasma to form carbon nanotube layers arranged along columns and rows.

In step (e"), a conductive layer can be formed on the whole carbon nanotube layers, and patterned by an etching step to form a plurality of source electrodes and drain electrodes separately connected to the carbon nanotube layers. Further, when the insulating layers covers the carbon nanotube layers, another conductive layer can be formed on the entire insulating layers, and patterned by an etching step to form a plurality of gate electrodes opposite to the carbon nanotube layers.

In step (f"), an insulating layer can be covered on the whole carbon nanotube layers, source electrodes and drain electrodes, and then patterned by an etching step to form a plurality of insulating layers corresponding to the carbon nanotube layers.

The method for making thin film transistor provided in the present embodiments comprise the following superior properties. Firstly, the carbon nanotube film used as the semiconducting layer is simply pulled from a carbon nanotube array directly. The carbon nanotubes in the carbon nanotube film are uniformly dispersed. The purity of the carbon nanotube film is relatively high. Secondly, the carbon nanotube film is adhesive and can be easily adhered in a desired place at a low temperature (e.g., room temperature). Thus, the substrate can be selected from a flexible plastic or resin. Thirdly, the carbon nanotubes in the carbon nanotube film are aligned along a same direction and joined by Van der Waals attractive force. Thus, in the semiconducting layer of the thin film transistor, the carbon nanotubes can be easily arranged to align along a direction from source electrode to drain electrode. Accordingly, the carrier mobility of the thin film transistor can be improved.

It is to be understood that the above-described embodiments are intended to illustrate rather than limit the invention. Variations may be made to the embodiments without departing from the spirit of the invention as claimed. The above-described embodiments illustrate the invention but do not restrict the scope of the invention.

It is also to be understood that above description and the claims drawn to a method may include some indication in reference to certain steps. However, the indication used is only to be viewed for identification purposes and not as a suggestion as to an order for the steps.

The invention claimed is:

1. A method for making a thin film transistor, the method comprising the steps of:
    (a) providing a carbon nanotube array and an insulating substrate;
    (b) pulling out a first carbon nanotube film and a second carbon nanotube film from the carbon nanotube array by using a tool, each of the first and second carbon nanotube films comprising a plurality of carbon nanotubes being primarily oriented along the same direction;
    (c) forming a semiconducting layer by:
        placing the first carbon nanotube film on a surface of the insulating substrate along a first direction; and
        stacking the second carbon nanotube film on the first carbon nanotube film along a second direction such that the carbon nanotubes in the first carbon nanotube film are oriented along a different direction than the carbon nanotubes in the second carbon nanotube film;
    (d) forming a source electrode, a drain electrode, and a gate electrode; and
    (e) covering the carbon nanotube layer with an insulating layer;
    wherein the source electrode and the drain electrode are spaced from each other, and electrically connected to the carbon nanotube layer; the gate electrode is located on the insulating layer and electrically insulated from the carbon nanotube layer by the insulating layer.

2. The method as claimed in claim 1, wherein the plurality of carbon nanotubes are joined end to end by the van der Waals attractive force therebetween.

3. The method as claimed in claim 2, wherein the carbon nanotubes are semiconducting carbon nanotubes.

4. The method as claimed in claim 2, wherein the directions of the carbon nanotubes extend substantially from the source electrode to the drain electrode.

5. The method as claimed in claim 4, wherein the source electrode and the drain electrode are formed directly on the carbon nanotube layer.

6. The method as claimed in claim 1, further comprising a step (g) of eliminating metallic carbon nanotubes in the carbon nanotube layer.

7. The method as claimed in claim 6, wherein step (g) further comprises a step of applying a voltage between the source electrode and the drain electrode in order to break down the metallic carbon nanotubes in the carbon nanotube layer.

8. The method as claimed in claim 6, wherein step (g) further comprises a step of irradiating the carbon nanotube layer with a hydrogen plasma, microwave, terahertz, infrared, ultraviolet, or visible light in order to break down the metallic carbon nanotubes in the carbon nanotube layer.

9. The method as claimed in claim 1, further comprising an additional step of adhering the carbon nanotube layer to the surface of the insulating substrate by treating the carbon nanotube layer with an organic solvent after step (c).

10. The method as claimed in claim 1, wherein a material of the insulating substrate is selected from the group consisting of plastic and resin.

11. The method as claimed in claim 1, wherein in step (e), the insulating layer covers the source electrode and the drain electrode.

12. The method as claimed in claim 11, wherein step (e) further comprises a step of exposing a part of the source electrode and the drain electrode.

13. The method as claimed in claim 1, wherein a material of the source electrode, drain electrode, and gate electrode is metallic carbon nanotubes.

14. A method for making a thin film transistor, the method comprising the steps of:
    (a') providing a carbon nanotube array and an insulating substrate;
    (b') pulling out a first carbon nanotube film and a second carbon nanotube film from the carbon nanotube array by using a tool, each of the first and second carbon nanotube films comprising a plurality of carbon nanotubes being primarily oriented along the same direction;
    (c') forming a gate electrode, a source electrode, and a drain electrode;
    (d') covering the gate electrode with an insulating layer;
    (e') forming a semiconducting layer by:
laying the first carbon nanotube film on the insulating layer along a first direction; and
    stacking the second carbon nanotube film on the first carbon nanotube film along a second direction such that the carbon nanotubes in the first carbon nanotube film are oriented along a different direction than the carbon nanotubes in the second carbon nanotube film; and wherein the gate electrode is located on the insulating substrate, and the source electrode and the drain electrode are electrically connected to the carbon nanotube layer.

15. A method for making thin film transistors, the method comprising the steps of:
   (a") providing a carbon nanotube array and an insulating substrate;
   (b") pulling out a first carbon nanotube film and a second carbon nanotube film from the carbon nanotube array by using a tool, each of the first and second carbon nanotube films comprising a plurality of carbon nanotubes being primarily oriented along the same direction;
   (c") adhering a semiconducting layer on the insulating substrate by:
      placing the first carbon nanotube film on a surface of the insulating substrate along a first direction; and
      stacking the second carbon nanotube film on the first carbon nanotube film along a second direction such that the carbon nanotubes in the first carbon nanotube film are oriented along a different direction than the carbon nanotubes in the second carbon nanotube film;
   (g") treating the carbon nanotube layer adhered on the insulating substrate with an organic solvent;
   (d") patterning the first and second carbon nanotube films, to form a plurality of carbon nanotube layers; and
   (e") forming a plurality of pairs of source electrodes, drain electrodes, and a plurality of gate electrodes;
   wherein the source electrodes and the drain electrodes are electrically connected to the carbon nanotube layers, the gate electrodes are electrically insulated from the carbon nanotube layers by the insulating layers.

16. The method as claimed in claim 15, wherein in step (d"), the first and second carbon nanotube films are cut by laser beam to form the carbon nanotube layers arranged along columns and rows.

17. The method as claimed in claim 15, wherein in step (d"), the first and second carbon nanotube films are etched by plasma to form the carbon nanotube layers arranged along columns and rows.

18. The method as claimed in claim 1, wherein the first and second carbon nanotube films are combined by van der Waals attractive force therebetween.

* * * * *